United States Patent
Xie et al.

(10) Patent No.: US 11,411,568 B1
(45) Date of Patent: Aug. 9, 2022

(54) BEIDOU SIGNAL TRACKING SYSTEM WITH NONLINEAR PHASE-LOCKED LOOP

(71) Applicants: Guangdong University of Technology, Guangdong (CN); Russian Academy of Engineering, Moscow (RU)

(72) Inventors: Kan Xie, Guangdong (CN); Shengli Xie, Guangdong (CN); Guoxu Zhou, Guangdong (CN); Haochuan Zhang, Guangdong (CN); Xiaobo Gu, Guangdong (CN); Victor Fedorovich Kuzin, Moscow (RU)

(73) Assignees: Guangdong University of Technology, Guangdong (CN); Russian Academy of Engineering, Moscow (RU)

( * ) Notice: Subject to any disclaimer, the term of this patent is extended or adjusted under 35 U.S.C. 154(b) by 0 days.

(21) Appl. No.: 17/585,613

(22) Filed: Jan. 27, 2022

(30) Foreign Application Priority Data

Aug. 31, 2021 (CN) .......................... 202111017105.4

(51) Int. Cl.
*H03L 7/093* (2006.01)
*H03H 17/02* (2006.01)
*H03L 7/099* (2006.01)

(52) U.S. Cl.
CPC ............. *H03L 7/093* (2013.01); *H03H 17/02* (2013.01); *H03L 7/099* (2013.01)

(58) Field of Classification Search
CPC ................................. H03L 7/093; H03L 7/099
See application file for complete search history.

(56) References Cited

U.S. PATENT DOCUMENTS

| | | | | |
|---|---|---|---|---|
| 5,767,713 A * | 6/1998 | Williams | ................ | H03L 7/089 327/155 |
| 6,531,927 B1 * | 3/2003 | Chen | ................... | H03L 7/087 331/25 |
| 6,823,133 B1 * | 11/2004 | Adkins | ................ | G05B 19/293 388/805 |
| 8,866,519 B1 * | 10/2014 | Hiebert | ................ | H03L 7/1976 327/147 |

(Continued)

FOREIGN PATENT DOCUMENTS

| CN | 109889195 A | * | 6/2019 |
|---|---|---|---|
| CN | 110572179 A | * | 12/2019 |

(Continued)

*Primary Examiner* — Adam D Houston

(57) ABSTRACT

The present disclosure discloses a Beidou signal tracking system with a nonlinear phase-locked loop. A nonlinear element and a low-pass filter are added behind a loop filter to adapt to an output from control of the loop filter, and then to control a phase of an output signal. An in-phase branch pre-filtering link is added before the loop filter to smoothly processing an input signal, and a loop filter of a third-order phase-locked loop assisted by a second-order frequency-locked loop is selected to ensure basic performance index of an algorithm. The in-phase branch pre-filtering link controls signal change of an in-phase branch signal within a reasonable range. The nonlinear element and the low-pass filter behind the loop filter, after proper selection of parameters, can make the phase-locked loop quickly lock within the range where the phase-locked loop could not be locked originally.

3 Claims, 2 Drawing Sheets

(56) References Cited

U.S. PATENT DOCUMENTS

| | | | | |
|---|---|---|---|---|
| 2005/0046490 A1* | 3/2005 | Jasa | ........................ | H03L 7/087 331/25 |
| 2008/0297265 A1* | 12/2008 | Tarng | ........................ | H03L 5/00 331/116 R |
| 2020/0177190 A1* | 6/2020 | Shumaker | ................ | H03L 7/099 |
| 2021/0203333 A1* | 7/2021 | Kushnir | .................. | H03L 7/093 |

FOREIGN PATENT DOCUMENTS

| | | | | | |
|---|---|---|---|---|---|
| CN | 111130538 | A | * | 5/2020 | |
| CN | 111965683 | A | * | 11/2020 | |
| CN | 112179329 | A | * | 1/2021 | |
| CN | 113447965 | A | * | 9/2021 | |
| CN | 111308520 | B | * | 11/2021 | ............. G01S 19/29 |
| CN | 113702918 | A | * | 11/2021 | |
| RU | 2551805 | C2 | * | 5/2015 | |
| WO | WO-2020133711 | A1 | * | 7/2020 | ............. G01C 21/24 |

* cited by examiner

BEIDOU SIGNAL TRACKING SYSTEM WITH NONLINEAR PHASE-LOCKED LOOP

CROSS-REFERENCE TO RELATED APPLICATION

The present application claims priority to Chinese Application No. 202111017105.4, filed on Aug. 31, 2021, which is hereby incorporated by reference in its entirety.

FIELD

The present disclosure relates to the technical field of Beidou signal tracking, and in particular to a Beidou signal tracking system with a nonlinear phase-locked loop.

BACKGROUND

A Beidou positioning system can provide users with location information anytime and anywhere, and has been widely used in people's daily life. A phase-locked loop is a typical automatic control system having negative phase feedback. The phase-locked loop takes a phase error as a control object, and compares phases between a reference signal and an output signal of a voltage-controlled oscillator (VCO) to generate a phase deviation signal to adjust a frequency of the output signal of the VCO. Therefore, after the loop is stabilized, a phase difference between the two signals is controlled within a small range. This important feature of the phase-locked loop is widely used in telemetry and remote control systems, especially in the field of carrier synchronization and tracking.

In an application of a satellite navigation receiver with a carrier tracking loop, ionosphere scintillation is a difficult problem to overcome. The ionosphere scintillation is caused by an irregularity of an ionosphere structure and changes with the change of a magnetic field and a solar activity. When a navigation signal passes through the ionosphere, due to the influence of the ionosphere scintillation, quality of the signal is seriously disturbed, and the ionosphere scintillation will cause rapid fluctuations in a phase and an amplitude of the signal, referred as phase scintillation and amplitude scintillation, respectively. Strong ionosphere scintillation will lead to loss of lock of the carrier tracking loop. Therefore, it is necessary to enhance the robustness of the carrier tracking loop of the receiver and improve the fast locking performance and noise suppression capability of the phase-locked loop.

The traditional Beidou tracking algorithms include Kalman filter-based phase-locked loop (KFPLL), vector-based phase-locked loop (VPLL), and third-order phase-locked loop assisted by second-order frequency-locked loop-assisted (FAP). However, a traditional Beidou tracking algorithm has contradictions in tracking accuracy, convergence speed and noise suppression performance, which cannot be taken into account at the same time, and a channel in a vector tracking algorithm affected by ionosphere scintillation is assisted by other unaffected channels to estimate parameters, which leads to a problem of pollution diffusion.

SUMMARY

The present disclosure provides a Beidou signal tracking system with a nonlinear phase-locked loop, which is used to solve the technical problems that the traditional Beidou tracking algorithm cannot take into account the tracking accuracy, convergence speed and noise suppression performance at the same time, and the channel in the vector tracking algorithm affected by the ionosphere scintillation is assisted by other unaffected channels to estimate parameters which leads to a problem of pollution diffusion.

In view of this, the present disclosure provides a Beidou signal tracking system with a nonlinear phase-locked loop, including: an in-phase branch pre-filtering link, a phase detector, a loop filter, a nonlinear element, a low-pass filter and a voltage-controlled oscillator that are connected in sequence, the voltage-controlled oscillator having an output terminal connected to an input terminal of the phase detector; the loop filter being a loop filter of a third-order phase-locked loop assisted by a second-order frequency-locked loop; the in-phase branch pre-filtering link being of a mathematical model as:

$$I_{filt}(n) = \begin{cases} I(n), & K_{filt1} \leq \frac{|I(n)|}{I_{sm}(n)} \leq K_{filt2} \\ \text{sign}[I(n)] \cdot [\beta |I(n)| + (1-\beta)]I_{sm}(n-1), & \text{others} \end{cases},$$

where I(n) denotes an output signal of a branch I at a n-th sampling instant, $I_{sm}(n)$ denotes a signal of the branch I at the n-th sampling instant that is outputted after smoothing processing, $K_{filt1}$ denotes a lower threshold value of the in-phase branch pre-filtering link, $K_{filt2}$ denotes a higher threshold value of the in-phase branch pre-filtering link, and β denotes a weight; and the nonlinear element is of a mathematical model as:

$$N[U_c(t)] = \begin{cases} m_h U_c(t) + (m_h - m_l)y^*, & U_c(t) \leq -y^* \\ m_l U_c(t), & -y^* \leq U_c(t) \leq -y^* \\ m_h U_c(t) - (m_h - m_l)y^*, & y^* \leq U_c(t) \end{cases},$$

where $N[U_c(t)]$ denotes an output of a nonlinear element N, y* denotes an inflection point of the nonlinear element N, $m_h$ denotes a slope of a first piecewise linear function, mi denotes a slope of a second piecewise linear function, and $m_h > m_l$.

Optionally, β has a value ranging from 0.5 to 0.7.

Optionally, the signal of the branch I at the n-th sampling instant that is outputted after the smoothing processing is:

$$I_{sm}(n) = \begin{cases} \lambda I_{sm}(n-1) + (1-\lambda)|I(n)|, & K_{sm1} \leq \frac{|I(n)|}{I_{sm}(n)} \leq K_{sm2} \\ I_{sm}(n-1), & \text{others} \end{cases},$$

where λ denotes a forgetting factor and λ=exp $(-T_{coh})$, $T_{coh}$ denotes coherent integration time, and $K_{sm1}$ and $K_{sm2}$ denote higher and lower threshold values of the smoothing processing, respectively, $[K_{sm1}, K_{sm2}] \subset [K_{filt1}, K_{filt2}]$.

As can be seen from the above technical solutions, the embodiments of the present disclosure have the following advantages.

The present disclosure provides a Beidou signal tracking system with a nonlinear phase-locked loop. A nonlinear element and a low-pass filter are added behind a loop filter to adapt to an output from control of the loop filter, and then to control a phase of an output signal. An in-phase branch pre-filtering link is added before the loop filter to smoothly process an input signal, and a loop filter of a third-order phase-locked loop assisted by a second-order frequency-locked loop is selected to ensure a basic performance index of an algorithm. The in-phase branch pre-filtering link controls a signal change of an in-phase branch signal within a reasonable range. The nonlinear element and the low-pass filter behind the loop filter, after proper selection of parameters, can make the phase-locked loop quickly lock within the range where the phase-locked loop could not be locked originally. At the same time, after the output signal of the loop filter passes through the nonlinear element, noise information changes accordingly, such that the noise is filtered out by the subsequent low-pass filter to a certain extent, so as to obtain a more accurate deviation signal to control the VCO, thus making the loop more stable and making the loop no pollution diffusion problem for a vector tracking algorithm. In this way, the technical problems that the traditional Beidou tracking algorithm cannot take into account the tracking accuracy, convergence speed and noise suppression performance at the same time, the channel in the vector tracking algorithm affected by the ionosphere scintillation is assisted by other unaffected channels to estimate parameters which leads to a problem of pollution diffusion, are solved.

BRIEF DESCRIPTION OF DRAWINGS

In order to clearly explain technical solutions of embodiments of the present disclosure or in the related art, drawings used in the description of the embodiments or in the related art are briefly described below. Obviously, the drawings as described below are merely some embodiments of the present disclosure. Based on these drawings, other drawings can be obtained by those skilled in the art without creative effort.

DESCRIPTION OF EMBODIMENTS

In order to make those skilled in the art better understand the solutions of the present disclosure, the technical solutions in the embodiments of the present disclosure will be clearly and completely described below with reference to the accompanying drawings in the embodiments of the present disclosure. Obviously, the embodiments described below are only some of the embodiments of the present disclosure, rather than all embodiments of the present disclosure. On a basis of the embodiments of the present disclosure, all other embodiments obtained by those skilled in the art without creative work shall fall within the protection scope of the present disclosure.

Figure 1:
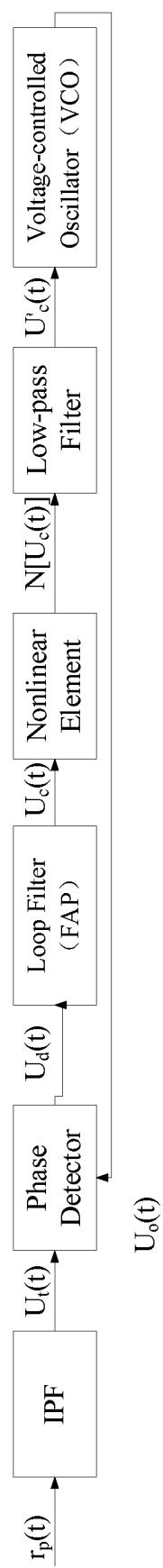
FIG. 1 is a structural schematic diagram of a Beidou signal tracking system with a nonlinear phase-locked loop according to an embodiment of the present disclosure.

For ease of understanding, referring to FIG. 1, a Beidou signal tracking system with a nonlinear phase-locked loop is provided in the present disclosure. The Beidou signal tracking system includes a loop filter, a nonlinear element, a low-pass filter, a voltage-controlled oscillator, a phase detector, and an in-phase branch pre-filtering link.

The in-phase branch pre-filtering link, the phase detector, the loop filter, the nonlinear element, the low-pass filter and the voltage-controlled oscillator are connected in sequence. The voltage-controlled oscillator has an output terminal connected to an input terminal of the phase detector.

The loop filter is a loop filter of a third-order phase-locked loop assisted by a second-order frequency-locked loop.

The in-phase branch pre-filtering link is of a mathematical model as:

$$I_{filt}(n) = \begin{cases} I(n), & K_{filt1} \leq \dfrac{|I(n)|}{I_{sm}(n)} \leq K_{filt2} \\ \operatorname{sign}[I(n)] \cdot [\beta|I(n)| + (1-\beta)]I_{sm}(n-1), & \text{others} \end{cases},$$

where I(n) denotes an output signal of a branch I at a n-th sampling instant, $I_{sm}(n)$ denotes a signal of the branch I at the n-th sampling instant that is outputted after smoothing processing, $K_{filt1}$ denotes a lower threshold value of the in-phase branch pre-filtering link, $K_{filt2}$ denotes a higher threshold value of the in-phase branch pre-filtering link, and β denotes a weight. The nonlinear element is of a mathematical model as:

$$N[U_c(t)] = \begin{cases} m_h U_c(t) + (m_h - m_l)y^*, & U_c(t) \leq -y^* \\ m_l U_c(t), & -y^* \leq U_c(t) \leq -y^* \\ m_h U_c(t) - (m_h - m_l)y^*, & y^* \leq U_c(t) \end{cases},$$

where $N[U_c(t)]$ denotes an output of a nonlinear element N, y* denotes an inflection point of the nonlinear element N, $m_h$ denotes a slope of a first piecewise linear function, $m_l$ denotes a slope of a second piecewise linear function, and $m_h > m_l$.

A principle of the Beidou signal tracking system with the nonlinear phase-locked loop in the embodiment of the present disclosure is as follows.

(1) An in-phase branch pre-filtering link (IPF) is added before a phase detector, to remove a scintillation interference component of an input signal which is a received signal $r_p$(t) with the amplitude scintillation, and output an input signal $U_i(t)$ of a carrier tracking loop without amplitude scintillation.

The IPF constrains the amplitude. When an output result of the in-phase branch signal is within a reasonable range, the IPF directly outputs the current result, otherwise the IPF outputs a filtered in-phase signal. An IPF algorithm is modeled as:

$$I_{filt}(n) = \begin{cases} I(n), & K_{filt1} \leq \dfrac{|I(n)|}{I_{sm}(n)} \leq K_{filt2} \\ \operatorname{sign}[I(n)] \cdot [\beta|I(n)| + (1-\beta)]I_{sm}(n-1), & \text{others} \end{cases},$$

where, I(n) denotes an output signal of a branch I at a n-th sampling instant, $I_{sm}(n)$ denotes a signal of the branch I at the n-th sampling instant that is outputted after smoothing processing, $K_{filt1}$ denotes a lower threshold value of the in-phase branch pre-filtering link, $K_{filt2}$ denotes a higher threshold value of the in-phase branch pre-filtering link, and β denotes a weight. By testing under different loop noise bandwidths, β has an optimal parameter selection range of 0.5 to 0.7. It can be seen from the above model that the IPF algorithm reduces the interference caused by the amplitude scintillation by adjusting I(n) within an unreasonable range.

The in-phase branch signal after the smoothing processing is:

$$I_{sm}(n) = \begin{cases} \lambda I_{sm}(n-1) + (1-\lambda)|I(n)|, & K_{sm1} \leq \frac{|I(n)|}{I_{sm}(n)} \leq K_{sm2} \\ I_{sm}(n-1), & \text{others} \end{cases},$$

where $\lambda$ denotes a forgetting factor and $\Delta = \exp(-T_{coh})$, $T_{coh}$ denotes coherent integration time, and $K_{sm1}$ and $K_{sm2}$ denote higher and lower threshold values of the smoothing processing, respectively, $$[K_{sm1}, K_{sm2}] \subset [K_{filt1}, K_{filt2}].$$

The obtained $I_{filt}$ (n) is a correlation result of the branch I after reducing the influence of the amplitude scintillation. An input signal $U_i$ (t) of a pre-filtering loop can be obtained from $r_p(t) = I_{filt}(n) + jQ(n)$, and the obtained $r_p$ (t) is $U_i$ (t).

(2) The IPF-processed signal $U_i$ (t) passes through the phase detector. The phase detector identifies a phase error between the IPF-processed signal $U_i$ (t) and an output signal $U_0$ (t), that is, a phase detection result $U_d$ (t) contains phase error information. $U_d(t)$ contains a high frequency signal and a noise signal.

(3) $U_d$ (t) is input to the FAP loop filter, which can effectively reduce the noise of the phase detection result. A reasonable filtering result $U_c$ (t) makes the filtering result not only truly reflect the phase change of the input signal of the filter, but also prevents excessive noise from affecting the output of the VCO.

(4) The filtering result $U_c$ (t) is adjusted by the nonlinear element N to obtain an optimized processing signal $N[U_c$ (t)] containing a part of the loop noise, the optimized processing signal $N[U_c$ (t)] passes through the low-pass filter, and a filtering result $U_c'(t)$ with greatly reduced noise is obtained.

Figure 2:
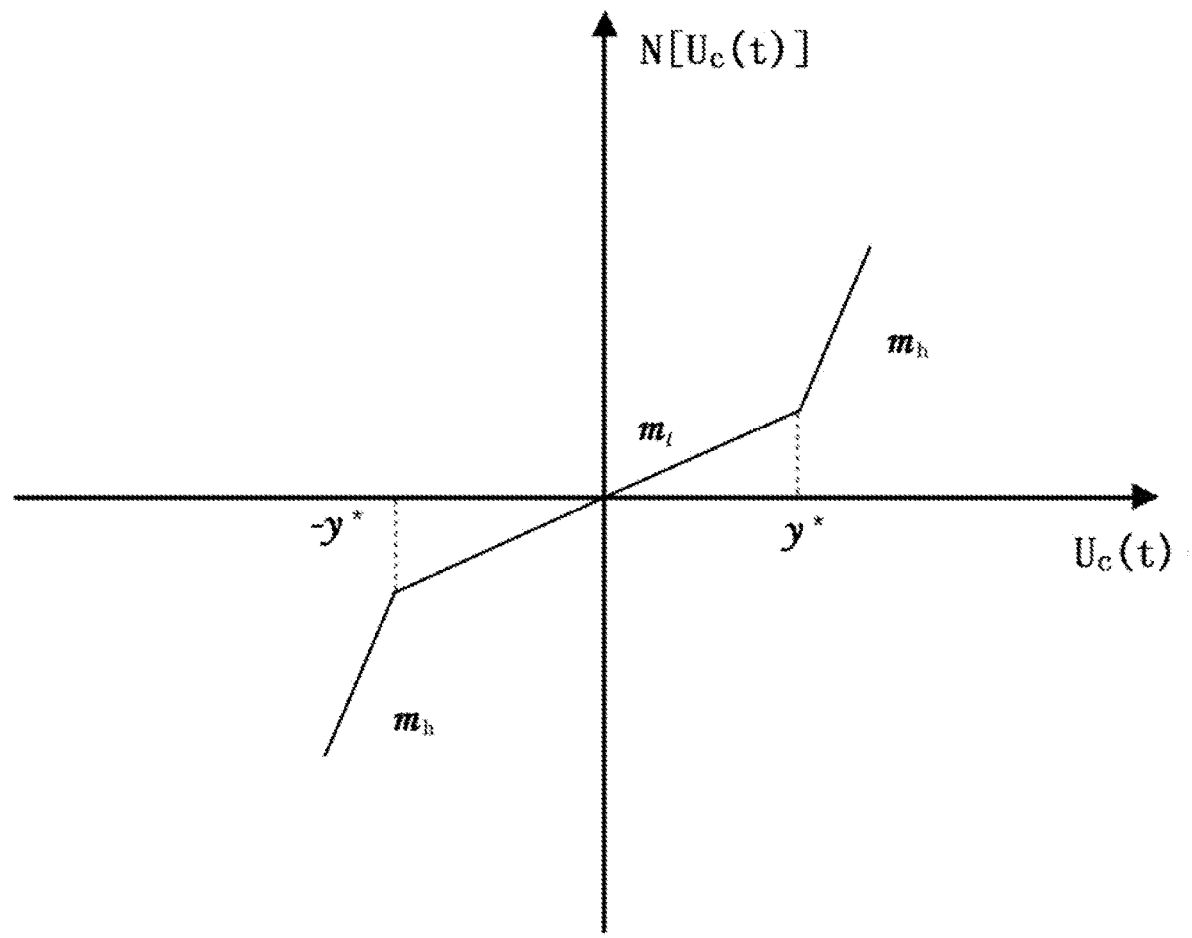
FIG. 2 is a mathematical model diagram of a nonlinear element according to an embodiment of the present disclosure.

The nonlinear element N is implemented by a piecewise function, as shown in FIG. 2, and is of a mathematical model as:

$$N[U_c(t)] = \begin{cases} m_h U_c(t) + (m_h - m_l)y^*, & U_c(t) \leq -y^* \\ m_l U_c(t), & -y^* \leq U_c(t) \leq -y^* \\ m_h U_c(t) - (m_h - m_l)y^*, & y^* \leq U_c(t) \end{cases}$$

where $N[U_c(t)]$ denotes an output of the nonlinear element N, y* denotes an inflection point of the nonlinear element N, $m_h$ denotes a slope of a first piecewise linear function, mi denotes a slope of a second piecewise linear function, and $m_h > m_l$.

According to the mathematical model of the nonlinear element N, the reasonable selection of three parameters y*, $m_h$ and $m_l$ determines comprehensive performance of the loop. When the phase-locked loop starts to work, a frequency-phase error is usually very large, $U_c$ (t) is greater than the inflection point y*, and the amplification effect of $m_h$ can quickly adjust an oscillation frequency, such that the frequency-phase error can be reduced in a very short time. After the phase-locked loop works for a period of time, the feedback control effect of the loop reduces the frequency-phase error to a certain extent, $U_c$ (t) will be smaller than the inflection point y*, and the reduction effect of mi will reduce $U_c$ (t) and input noise to adjust the oscillation frequency of the VCO. Therefore, the nonlinear phase-locked loop has faster and more accurate tracking performance.

(5) The output signal $U_c'(t)$ of the low-pass filter is then used as a control signal and is input to the VCO to generate a periodic oscillation signal $U_0(t)$ of a certain frequency, which is used as an input of the phase detector to continuously obtain the deviation signal.

The present disclosure provides a Beidou signal tracking system with a nonlinear phase-locked loop. A nonlinear element and a low-pass filter are added behind a loop filter to adapt to an output from control of the loop filter, and then to control a phase of an output signal. An in-phase branch pre-filtering link is added before the loop filter to smoothly process an input signal, and a loop filter of a third-order phase-locked loop assisted by a second-order frequency-locked loop is selected to ensure a basic performance index of an algorithm. The in-phase branch pre-filtering link controls a signal change of an in-phase branch signal within a reasonable range. The nonlinear element and the low-pass filter behind the loop filter, after proper selection of parameters, can make the phase-locked loop quickly lock within the range where the phase-locked loop could not be locked originally. At the same time, after the output signal of the loop filter passes through the nonlinear element, noise information changes accordingly, such that the noise is filtered out by the subsequent low-pass filter to a certain extent, so as to obtain a more accurate deviation signal to control a voltage-controlled oscillator, thus making the loop more stable and making the loop have no pollution diffusion problem for a vector tracking algorithm. In this way, the technical problems that the traditional Beidou tracking algorithm cannot take into account the tracking accuracy, convergence speed and noise suppression performance at the same time, a channel in the vector tracking algorithm affected the ionosphere scintillation is assisted by other unaffected channels to estimate parameters which leads to a problem of pollution diffusion, are solved.

As described above, the above embodiments are only used to illustrate the technical solutions of the present disclosure, but not to limit them; and although the present disclosure has been described in detail with reference to the foregoing embodiments, those of ordinary skill in the art should understand that: the technical solutions recorded in the foregoing embodiments may still be modified, or some of the technical features thereof may be equivalently replaced; and these modifications or replacements do not make the essence of the corresponding technical solutions deviate from the scope of technical solutions of the embodiments of the present disclosure.

What is claimed is:

1. A Beidou signal tracking system with a nonlinear phase-locked loop, comprising:
   an in-phase branch pre-filtering link, a phase detector, a loop filter, a nonlinear element, a low-pass filter and a voltage-controlled oscillator that are connected in sequence,
   wherein the voltage-controlled oscillator has an output terminal connected to an input terminal of the phase detector;
   the loop filter is a loop filter of a third-order phase-locked loop assisted by a second-order frequency-locked loop;
   the in-phase branch pre-filtering link is of a mathematical model as:

$$I_{filt}(n) = \begin{cases} I(n), & K_{filt1} \leq \frac{|I(n)|}{I_{sm}(n)} \leq K_{filt2} \\ \text{sign}[I(n)] \cdot [\beta|I(n)| + (1-\beta)]I_{sm}(n-1), & \text{others} \end{cases},$$

where I(n) denotes an output signal of a branch I at a n-th sampling instant, $I_{sm}(n)$ denotes a signal of the branch I at the n-th sampling instant that is outputted after smoothing processing, $K_{filt1}$ denotes a lower threshold value of the in-phase branch pre-filtering link, $K_{filt2}$ denotes a higher threshold value of the in-phase branch pre-filtering link, and β denotes a weight; and the nonlinear element is of a mathematical model as:

$$N[U_c(t)] = \begin{cases} m_h U_c(t) + (m_h - m_l)y^*, & U_c(t) \leq -y^* \\ m_l U_c(t), & -y^* \leq U_c(t) \leq -y^* \\ m_h U_c(t) - (m_h - m_l)y^*, & y^* \leq U_c(t) \end{cases}$$

where $N[U_c(t)]$ denotes an output of a nonlinear element N, y* denotes an inflection point of the nonlinear element N, $m_h$ denotes a slope of a first piecewise linear function, $m_l$ denotes a slope of a second piecewise linear function, and $m_h > m_l$.

2. The Beidou signal tracking system with the nonlinear phase-locked loop according to claim 1, wherein β has a value ranging from 0.5 to 0.7.

3. The Beidou signal tracking system with the nonlinear phase-locked loop according to claim 1, wherein the signal of the branch I at the n-th sampling instant that is outputted after the smoothing processing is:

$$I_{sm}(n) = \{\lambda I_{sm}(n-1)+(1-\lambda)|I(n)|, K_{sm1} \leq |I(n)| / I_{sm}(n) \leq K_{sm2}, I_{sm}(n-1), \text{others}$$

where λ denotes a forgetting factor and $\Delta = \exp(-T_{coh})$, $T_{coh}$ denotes coherent integration time, and $K_{sm1}$ and $K_{sm2}$ denote higher and lower threshold values of the smoothing processing, respectively, $[K_{sm1}, K_{sm2}] \subset [K_{filt1}, K_{filt2}]$.

* * * * *